(12) United States Patent
Chiang et al.

(10) Patent No.: US 9,059,094 B2
(45) Date of Patent: Jun. 16, 2015

(54) SEMICONDUCTOR GATE STRUCTURE AND METHOD OF FABRICATING THEREOF

(75) Inventors: Chun Ling Chiang, Hsinchu (TW);
Chun Ming Cheng, Hsinchu (TW);
Kuang Chao Chen, Taipei (TW)

(73) Assignee: Macronix International Co., Ltd., Hsin-chu (TW)

( * ) Notice: Subject to any disclaimer, the term of this patent is extended or adjusted under 35 U.S.C. 154(b) by 326 days.

(21) Appl. No.: 13/594,100

(22) Filed: Aug. 24, 2012

(65) Prior Publication Data
US 2014/0054655 A1 Feb. 27, 2014

(51) Int. Cl.
*H01L 29/94* (2006.01)
*H01L 21/28* (2006.01)
*H01L 29/423* (2006.01)

(52) U.S. Cl.
CPC .... *H01L 21/28167* (2013.01); *H01L 21/28273* (2013.01); *H01L 29/42324* (2013.01)

(58) Field of Classification Search
USPC ............... 257/330–333, 395–397, E29.02
See application file for complete search history.

(56) References Cited

U.S. PATENT DOCUMENTS

| | | | |
|---|---|---|---|
| 6,391,722 B1 * | 5/2002 | Koh ............................. 438/264 |
| 6,724,036 B1 * | 4/2004 | Hsieh et al. .................. 257/316 |
| 7,663,178 B2 * | 2/2010 | Arai et al. ..................... 257/315 |
| 8,344,473 B2 * | 1/2013 | Shimizu ....................... 257/506 |
| 2008/0283898 A1 | 11/2008 | Kuniya |
| 2010/0072535 A1 * | 3/2010 | Takashima et al. .......... 257/324 |

* cited by examiner

*Primary Examiner* — Matthew E Warren
(74) *Attorney, Agent, or Firm* — Alston & Bird LLP (57) ABSTRACT

A semiconductor gate structure is provided having a trench, the trench assembled by a dielectric structure and a stack structure. A first conductive layer may be conformally applied to the dielectric structure and the stack structure. An oxide layer is formed along the first conductive layer and may then be substantially removed from the first conductive layer. In certain gate structures, a conductive fill structure having the first conductive layer and a second conductive layer may be disposed on the stack structure and the dielectric structure.

8 Claims, 9 Drawing Sheets

Plasma oxidation (c-1)

FIG. 1C

Wet Clean (c-2)

SEMICONDUCTOR GATE STRUCTURE AND METHOD OF FABRICATING THEREOF

TECHNOLOGICAL FIELD

The present invention generally relates to a structure of a semiconductor device and a method of forming the semiconductor device. In particular, the present invention relates to a gate structure of the semiconductor device and a method for forming the gate structure of the semiconductor device.

BACKGROUND

Shallow trench isolation ("STI") is a technique used for the isolation of neighboring transistors in a semiconductor device. It is particularly preferred in smaller isolation regions such as those experienced in sub-0.5 nm processing. Generally, shallow trenches are etched in the silicon and one or more dielectric materials are deposited in the trenches. Additional processing may be used to remove excess dielectric material, such as, for example, chemical-mechanical planarization.

In particular, multiple masking, ion implantation, annealing, plasma etching, and chemical and physical vapor deposition steps may be used in forming shallow trench structures in, for example, a shield gate semiconductor or other semiconductor gate structures.

More specifically, in an exemplary process for forming isolated areas on a semiconductor wafer involves growing a very thin silicon oxide layer on the order of 3 nm to 8 nm on a substrate of the wafer followed by depositing a layer of silicon nitride on the order of 100 nm to 250 nm, which is used as an oxide barrier. A patterned etch resistant resist layer is formed on the surface to define the areas where shallow trenches will not be formed and the shallow trenches are then etched into the substrate. The extent of etching proceeds even through under-etching of the silicon oxide layer into the silicon substrate defining wafer. The etched trenches are defined by sidewalls and a bottom.

An oxide liner is then applied across the surfaces (sidewalls and bottom) of the trench. The oxide liner does not substantially fill the trench. Rather, the oxide liner is applied to form a connected, continuous layer of silicon oxide across the wafer that is defined by the very thin silicon oxide layer applied to the wafer and the oxide liner applied across the surface of the trenches.

Optionally, the oxide liner may act as a sacrificial oxide for ion implantation into the sidewalls of the trench. Optionally, a nitride layer may be disposed across the oxide liner.

The remaining open space of the trench not occupied by the liner oxide is filled with a deposited oxide. Excess deposited oxide is removed with chemical mechanical planarization. Finally, the silicon nitride mask acting as the oxide barrier is removed.

Differences in STI geometries and variability in STI sizes can lead to vastly different charge buildup in the isolation oxide resulting in unexpected responses of the semiconductor gate response in operation. During the fabrication process, it is difficult to precisely control planarity and trench fill. For example, the trench oxide may become variably recessed below the active region of the gate oxide layer causing variations in peak electric fields that are experienced in the corner region of the trench.

Conventional processing techniques for controlling the gate to drain capacitance in a metal-oxide semiconductor using trench structures are notoriously limited resulting in a semiconductor having varying performance characteristics as a result of non-uniformity in passivation layer thicknesses and aspect ratios throughout the filled trench and other variations resulting from the fabrication processes.

There remains a need in the art for an improved system, process or method for filling the trenches of a semiconductor.

BRIEF SUMMARY OF EXEMPLARY EMBODIMENTS

Embodiments of the present invention are therefore provided that may provide for a shielded gate semiconductor comprising filled trenches that have a substantial reduction in void space.

An aspect of the invention provides a method for fabricating a gate structure comprising providing a trench, the trench defined by a dielectric structure and a stack structure; forming a first conductive layer conformally over the dielectric structure and the stack structure; and forming an oxide layer on a top region of the first conductive layer.

In certain embodiments of the invention, the oxide layer is formed using a plasma oxidation process. Further pursuant to this embodiment of the invention, the plasma oxidation may be operated at a pressure in a range of from about 0.1 torr to about 0.5 torr. The oxide layer may then be removed from the first conductive layer. In certain embodiments of the invention, the oxide layer may be removed using, for example, a wet clean process. In another embodiment of the invention, the oxide layer may be formed from at least a portion of the first conductive layer.

In certain embodiments of the invention, the method of fabricating a gate structure comprises forming a second conductive layer on the first conductive layer.

In an embodiment of the invention, the first conductive layer has a first thickness adjacent to the dielectric structure and a second thickness at another region adjacent to the stack structure, and the ratio of the first thickness to the second thickness is in a range of from about 50% to about 95%.

An aspect of the invention provides a gate structure comprising a trench, the trench defined by a dielectric structure, and a stack structure and a conductive fill structure disposed on the stack structure and the dielectric structure. In an embodiment of the invention, the stack structure may comprise a substrate, a first dielectric layer disposed on the substrate, a stack conductive layer disposed on the first dielectric layer, and a second dielectric layer disposed on the stack conductive layer.

In certain embodiments of the invention, the dielectric structure extends to the substrate and is adjacent to the stack structure.

In certain embodiments of the invention, the conductive fill structure comprises two or more conductive layers. In certain embodiments of the invention, the two or more conductive layers of the conductive fill structure comprise a first conductive layer conformally disposed along the dielectric structure and the stack structure. In other embodiments of the invention, the two or more conductive layers may comprise a second conductive layer disposed on the first conductive layer.

In an embodiment of the invention, the first conductive layer of the gate structure has a first thickness adjacent to the dielectric structure and a second thickness at another region adjacent to the stack structure, and the ratio of the first thickness to the second thickness is in a range of from about 50% to about 95%.

In certain embodiments of the invention, a bottom portion of the trench is defined by the stack structure. In certain embodiments of the invention, a sidewall portion of the trench is defined by the dielectric structure.

In certain embodiments of the invention, the first conductive layer may have an opening that is approximately U-shaped. In certain other embodiments of the invention, the first conductive layer may have an opening that is approximately V-shaped.

These embodiments of the invention and other aspects and embodiments of the invention will become apparent upon review of the following description taken in conjunction with the accompanying drawings. The invention, though, is pointed out with particularity by the appended claims.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "a gate structure" includes a plurality of such gate structures.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

As used herein, "shallow trench" is intended to mean the structure employed in shallow trench isolation ("STI") of a semiconductor. Generally, a shallow trench is defined by sidewalls and a bottom. However, in some shallow trenches, depending on the aspect ratio and depth of the trench, the formation of a distinct bottom portion, in some cases, may not be clearly distinguishable from the convergence of the sidewalls at the bottom portion of the trench.

The inventors have conceived of and have developed systems, processes and methodologies for improved fabrication of semiconductor devices. In particular, the inventors have conceived of and developed systems, processes and methodologies for filling the trenches of such semiconductor devices.

The inventors have discovered that it is possible to reduce the variation in sidewall liners and dielectric fill of a trench of a semiconductor device. In particular, the inventors have discovered that plasma oxidation may be used to improve the polysilicon layer profile across the sidewalls and bottom of a trench defining a control gate fill structure.

The systems, processes and methods conceived by the inventors include the use of plasma oxidation to form a conformal polysilicon layer. In certain embodiments of the invention, a low pressure plasma oxidation process is used to form a thicker oxide layer over the conformal polysilicon layer followed by removal the oxide layer to form a better defined trench. In certain embodiments of the invention, a polysilicon layer may be deposited into the trench to fill up the trench entirely.

In certain embodiments of the invention, systems, processes and methods provide for an improved polysilicon layer profile while having a substantial reduction in void. FIGS. 1A-1D illustrates representative trench isolation profiles following each step of an embodiment of the invention.

Figure 1A:
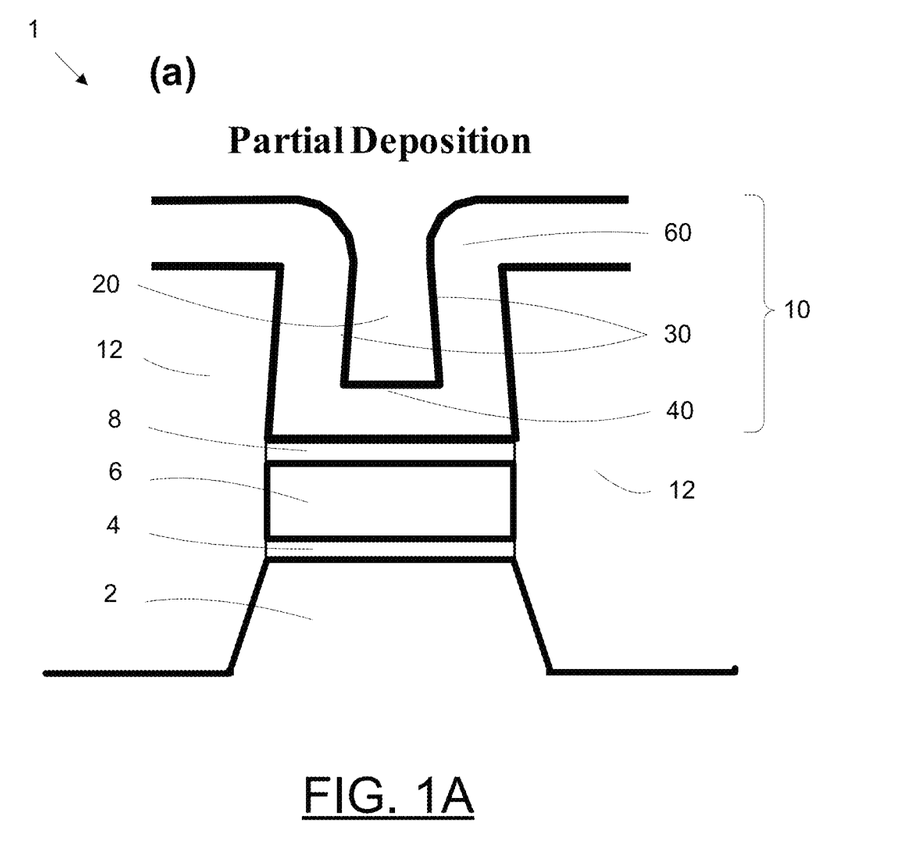
FIG. 1A illustrates a profile of a gate structure having a conductive fill structure defined by a trench following a partial deposition of an first polysilicon layer according to an embodiment of the invention.

FIG. 1A illustrates a profile of a gate structure following a partial deposition of a first polysilicon layer according to an exemplary embodiment of the invention. The gate structure 1 comprises a substrate 2 having a first dielectric layer 4 disposed thereon. A conductive layer 6 is disposed on the first dielectric layer 4, and a second dielectric layer 8 is disposed on the conductive layer 6. A shallow trench insulator 12 or shallow trench isolator is disposed beside the stack structure of the substrate 2, first dielectric layer 4, the conductive layer 6, and a second dielectric layer 8. A conductive fill structure 10 is disposed upon the second dielectric layer 8. In an embodiment of the invention, the first dielectric layer 4 is a tunnel oxide layer, the conductive layer 6 is a floating gate layer, the second dielectric layer 8 is a gate oxide layer, and the conductive fill structure 10 is a control gate. A shallow trench insulator 12 substantially surrounds the gate structure 1, as shown in the exemplary embodiment of FIG. 1A.

The conductive fill structure 10 partially fills a trench 20, which is defined by the second dielectric layer 8 and the shallow trench insulator 12. The trench 20 is defined by a sidewall 30 and a bottom 40. A first conductive layer 60 of the conductive fill structure 10 such as, for example, a first polysilicon layer is deposited conformally along the trench 20.— i.e., the sidewall 30 and the bottom 40 to partially fill the trench 20. The first conductive layer 60 may be deposited, for example, using a partial deposition process.

Subsequent figures show certain embodiments of the gate structure 1 specifically directed to the second conductive layer 10. While, for sake of brevity, these subsequent figures do not show the substrate 2, the first dielectric layer 4, the conductive layer 6, and the second dielectric layer 8, these components should still be assumed to be constituent components of the gate structure 1 even though they do not continue to be illustrated.

Figure 1B:
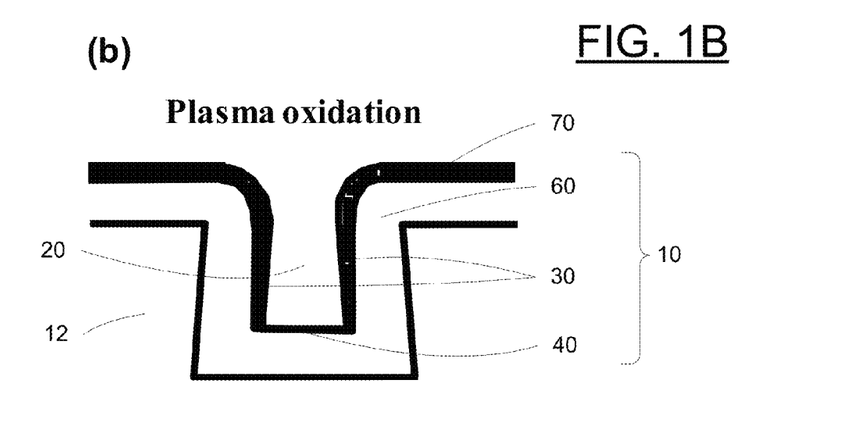
FIG. 1B illustrates a profile of a conductive fill structure following a plasma oxidation according to an embodiment of the invention.

FIG. 1B illustrates a profile of the conductive fill structure 10 following a plasma oxidation according to an exemplary embodiment of the invention. In embodiments of the invention, a plasma oxidation process deposits forms an oxide layer 70 along the sidewall 30 and bottom 40 of the trench 20. In certain preferred embodiments of the invention, plasma oxidation follows a partial deposition step. The oxide layer 70 is grown across the first conductive layer 60 conformally along the trench 20 using a plasma oxidation process.

In certain embodiments of the invention, the plasma oxidation process may be a low pressure plasma oxidation process. In other embodiments of the invention, any anisotropic oxidation process may be used to form the oxide layer 70.

In certain embodiments of the invention, the oxide layer 70 formed using a plasma oxidation process has a thickness that is at least 2 times greater, at least 3 times greater, at least 5 times greater, at least 7 times greater, at least 10 times greater, at least 20 times greater, at least 50 times greater, or at least 100 times greater than the thickness of the layer of oxide deposited by partial deposition.

In an embodiment of the invention, the oxide layer 70 grown by plasma oxidation or the oxide layer 70 grown using a combination of partial deposition and plasma oxidation techniques is removed from the trench 20. Any removal technique known in the art may be used to remove the oxide layer. In a preferred embodiment of the invention, a wet clean process is used to remove the oxide layer grown by plasma oxidation or the oxide layer grown using a combination of partial deposition and plasma oxidation techniques.

Figure 1C:
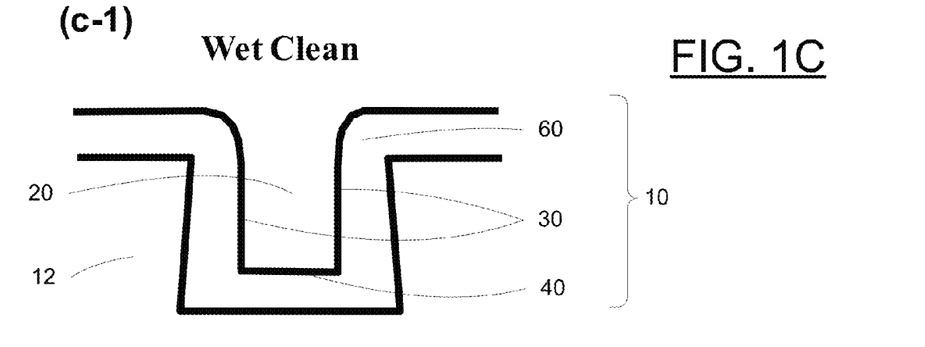
FIG. 1C illustrates a profile of a conductive fill structure following one step of a wet clean operation according to an embodiment of the invention.

FIG. 1C illustrates a profile of the conductive fill structure 10 following one step of a wet clean operation according to an embodiment of the invention, to remove the oxide layer 70 from the sidewall 30 and bottom 40 of the trench 20. The oxide layer 70 may be removed, for example, following one step of a wet clean process according to an embodiment of the invention. In an embodiment of the invention, following the wet clean process, the first conductive layer 60 may be disposed conformally across the trench 20. In certain embodiments of the invention, the conductive layer 60 that has been conformally disposed across the trench 20 may have an opening that is approximately U-shaped.

Figure 1D:
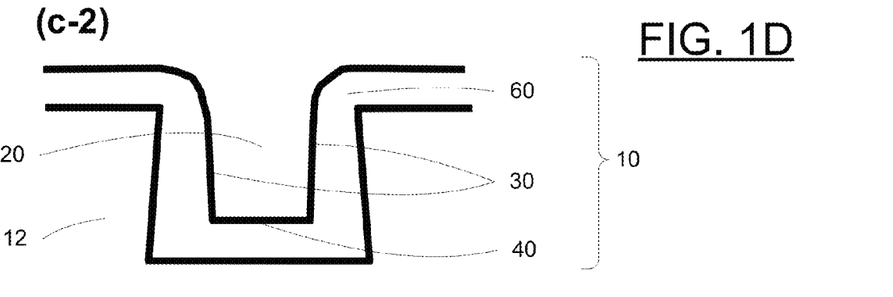
FIG. 1D illustrates a profile of a conductive fill structure following another step of a wet clean operation according to an embodiment of the invention.

FIG. 1D illustrates a profile of the conductive fill structure 10 following an operation, according to an embodiment of the invention, to remove the oxide layer 70 using, for example, another step of a wet clean process according to an embodiment of the invention. Following removal of the oxide layer 70, a second conductive layer of the conductive fill structure 10, such as a second conductive layer may be deposited on the first conductive layer 60 such that the second conductive layer substantially fills any opening, such as an approximate U-shaped opening, to complete the conductive fill structure 10.

Figure 2:
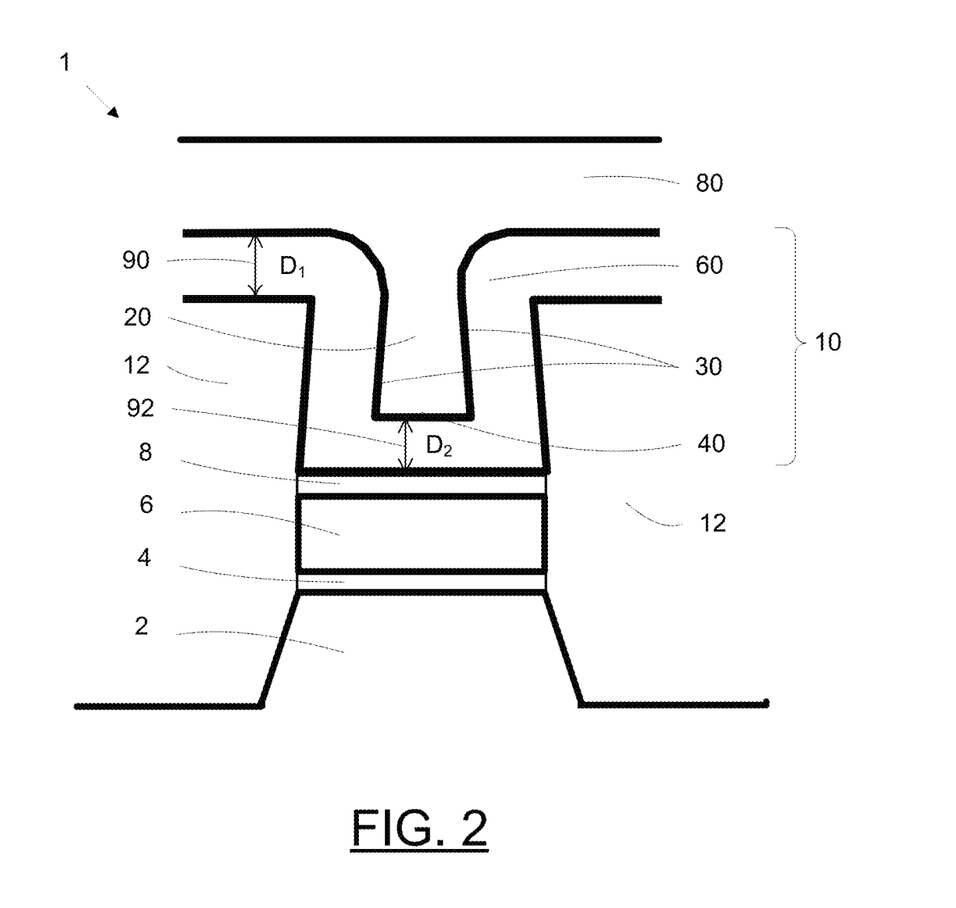
FIG. 2 illustrates a gate structure according to an embodiment of the invention.

FIG. 2 illustrates a gate structure of the invention having a conductive fill structure 10 with two conductive layers. The gate structure 1 of FIG. 2 is substantially similar to certain components described in FIGS. 1A-1D. However, in addition to the first conductive layer 60, a second conductive layer 80 has also been applied to the gate structure 1. According to certain embodiments of the invention, the second conductive layer 80 may be a polysilicon layer.

As shown in FIG. 2, the first conductive layer 60 has a thickness $D_1$ 90 at the top of the trench 20 adjacent to a region of the shallow trench insulator 12 or a dielectric structure and a thickness $D_2$ 92 at the bottom of the trench 20 or adjacent to a region of a stack structure. According to certain embodiments of the invention, the ratio of the thickness of the first conductive layer adjacent to the dielectric structure, $D_1$, relative to the thickness of the first conductive layer adjacent to the region of the stack structure, $D_2$ ranges from about 50% to about 95%.

Figure 3A:
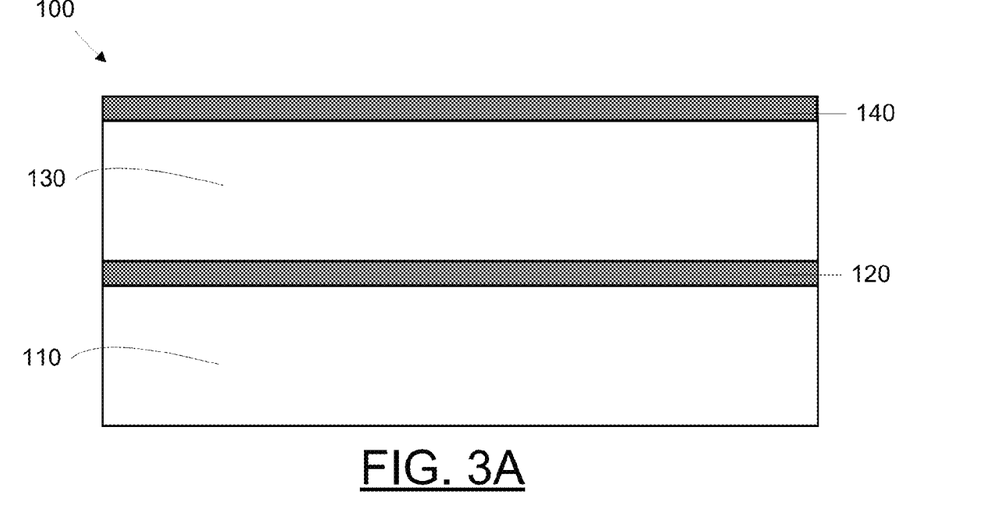
FIG. 3A illustrates a cross section of a gate structure according to an embodiment of the invention.
Figure 3B:
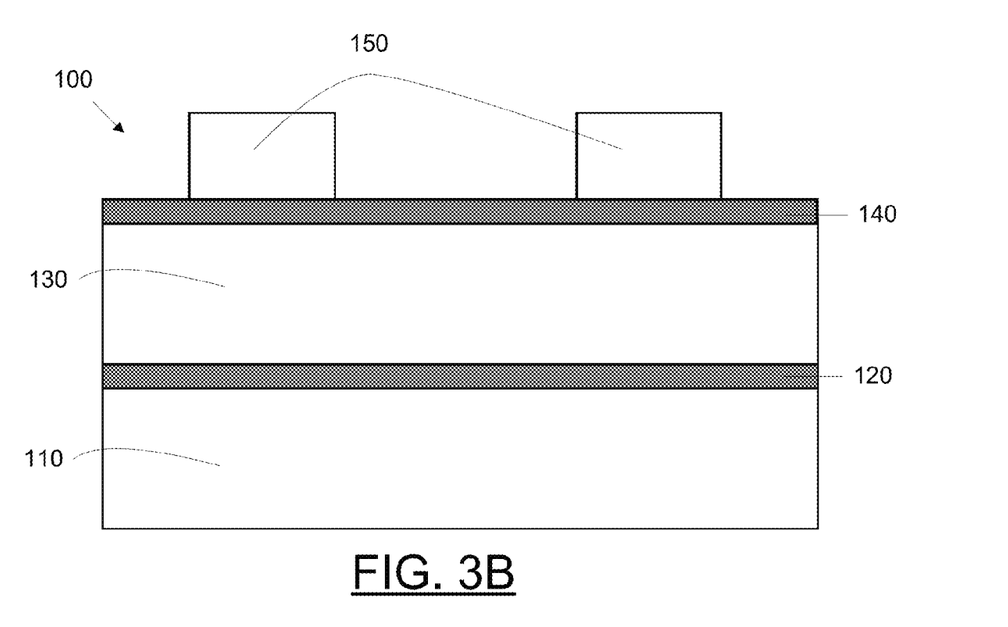
FIG. 3B illustrates a cross section of a gate structure following forming a hard mask according to an embodiment of the invention.

Embodiments of the present invention include a method of fabricating a semiconductor gate structure. For example, FIGS. 3A-3E illustrates a gate structure 100 following various steps of fabricating the trench 20 shown, for example, in FIGS. 1A-1D and FIG. 2 according to an embodiment of the invention. As shown in FIG. 3A, a gate structure 100 comprising a substrate 110, a first dielectric layer 120, a first conductive layer 130, and a second dielectric layer 140 may be provided according to certain embodiments of the invention. FIG. 3B illustrates the gate structure 100 following forming a hard mask 150 using for example photolithography according to certain embodiments of the invention.

Figure 3C:
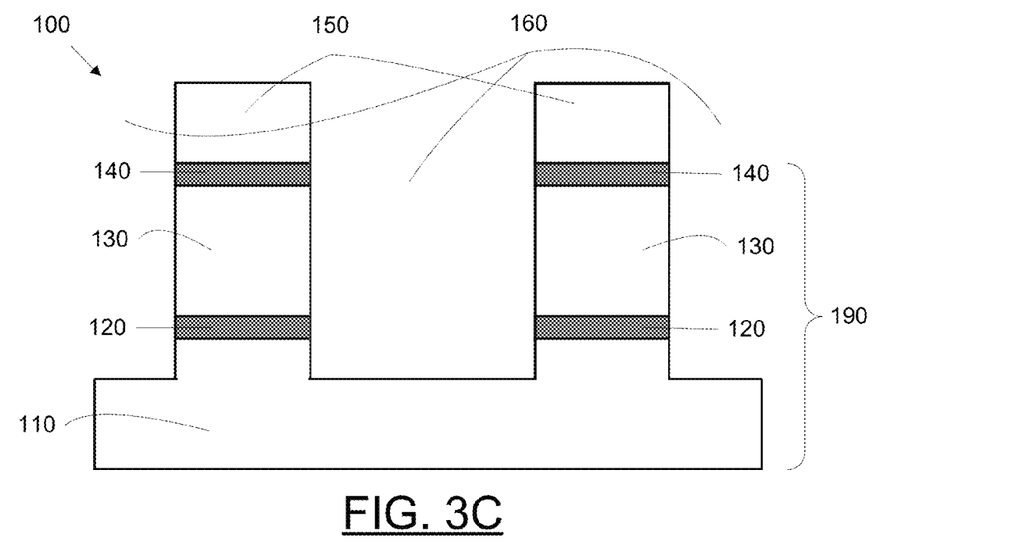
FIG. 3C illustrates a cross section of a gate structure following etching according to an embodiment of the invention.
Figure 3D:
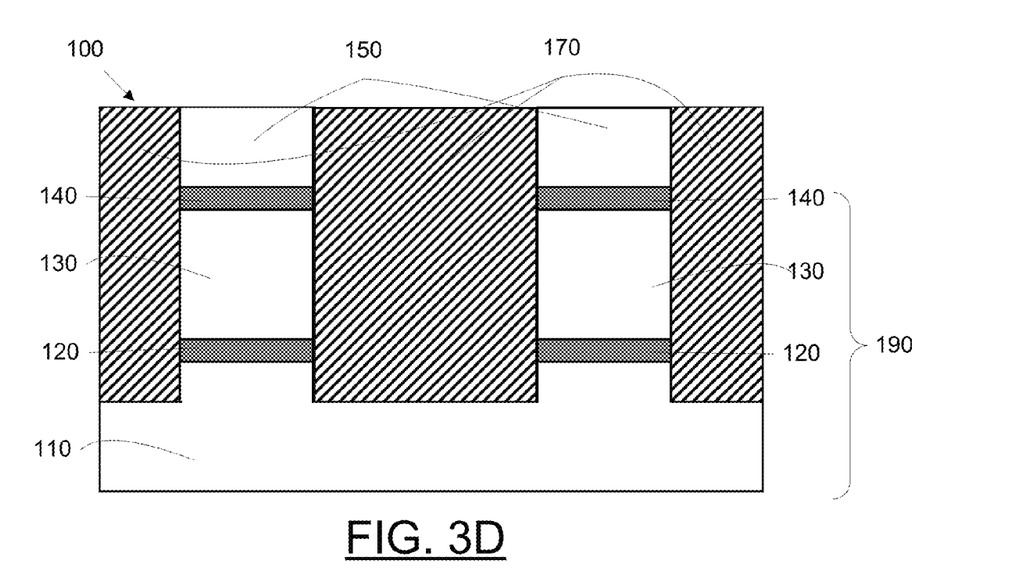
FIG. 3D illustrates a cross section of a gate structure following filling of the void spaces with a shallow trench insulator to define a dielectric structure according to an embodiment of the invention.

FIG. 3C shows the gate structure 100 after void spaces 160 have been etched into the gate structure 100. In particular, the void spaces begin to define stack structures 190. FIG. 3D shows the gate structure 100 after the void spaces 160 have been filled with a dielectric material to form a dielectric structure 170 acting as a shallow trench insulator according to certain embodiments of the invention.

Figure 3E:
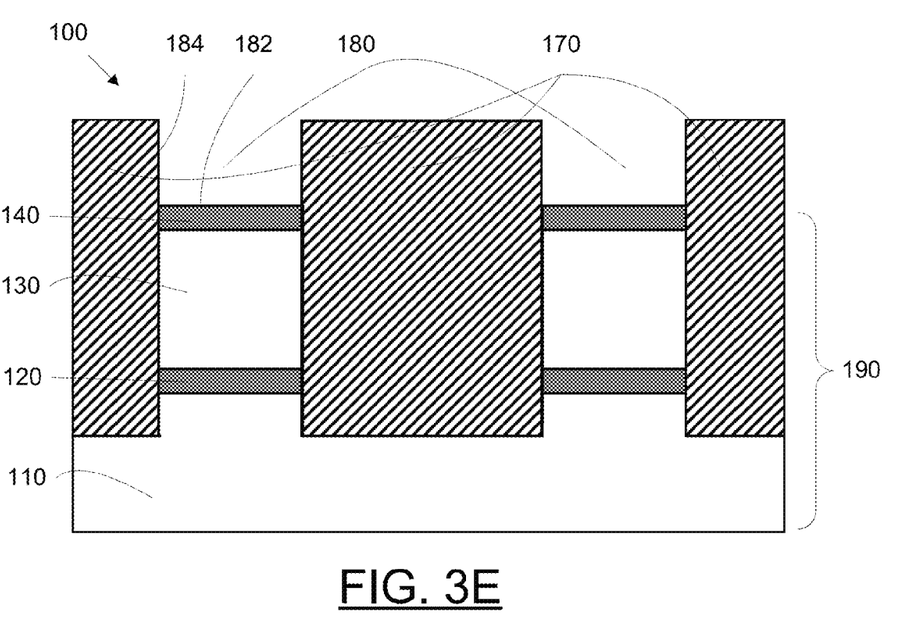
FIG. 3E illustrates a cross section of a gate structure following removal of the hard mask to define a trench according to an embodiment of the invention.

FIG. 3E shows trenches 180 that have been formed after removal of the hard mask 150. Any one trench 180 is defined by a stack structure 190 represented in this exemplary embodiment by the substrate 110, the first dielectric layer 120, the first conductive layer 130, and the second dielectric layer 140. Further to this exemplary embodiment, the stack structure 190 defines a bottom 182 of the trench 180. The trench 180 is also defined by a dielectric structure 170 which substantially defines a sidewall 184 of the trench 180.

In certain embodiments of the invention, a stack structure may define the sidewall while the dielectric structure may define the bottom. Indeed other configurations may be envisioned by a person of ordinary skill in the art having the benefit of this disclosure.

Figure 4:
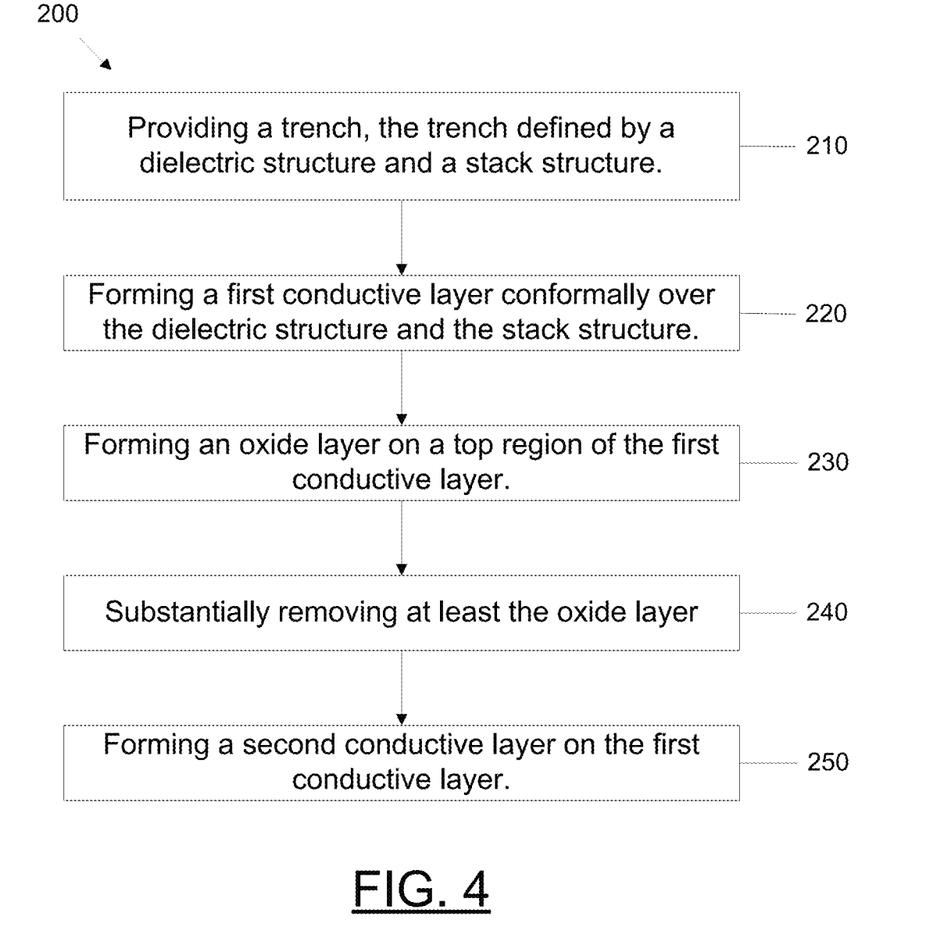
FIG. 4 is a flowchart illustrating a process for fabricating a semiconductor gate structure according to an embodiment of the invention.

FIG. 4 is a flowchart illustrating an embodiment of a process for fabricating a semiconductor gate structure. In certain embodiments of the invention, the method of fabricating a gate structure 200 comprises the step of providing a trench 210, the trench defined by a dielectric structure and a stack structure.

The method of fabricating a gate structure 200 comprises a step of forming a conductive layer conformally over the dielectric layer and the stack structure 220. As used herein, "conformally over" generally means disposing any such layer substantially continuously across certain surfaces of the dielectric layer and the stack structure to define such layer. Any method known in the art may be used to dispose the conformal first conductive layer on the conductive fill layer.

Figure 6:
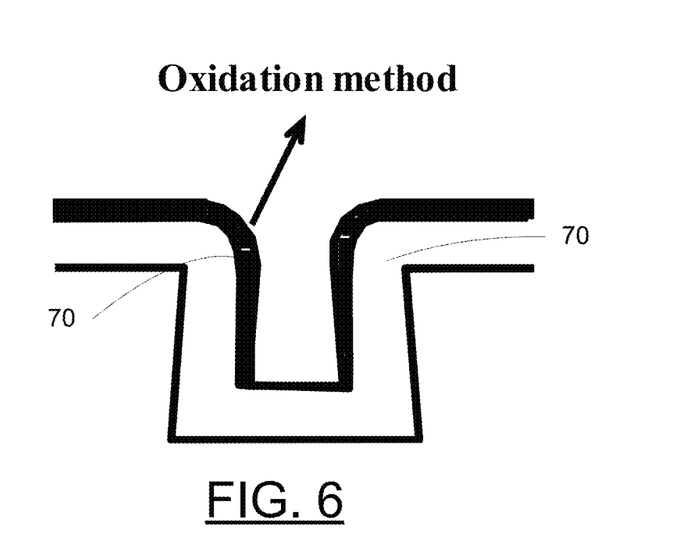
FIG. 6 illustrates a trench profile following an oxidation method for disposing oxide across the polysilicon layer of an conductive fill structure according to an embodiment of the invention.

The method of fabricating a semiconductor gate structure 200 additionally may comprise a step of forming an oxide layer on a top region of the conformal first conductive layer 230. Any method known in the art may be used to form an oxide layer across the first conductive layer. In certain embodiments of the invention, the oxide layer may be formed by converting at least a portion of the first conductive layer to the oxide layer. Any oxidation method known in the art may result in a trench profile having an oxide layer 60 as illustrated in FIG. 6.

In an embodiment of the invention, plasma oxidation may be used to form the oxide layer over the conformal first conductive layer. Plasma oxidation is a process for growing an oxide film onto a substrate that involves subjecting a silicon substrate to an oxygen enriched, or more specifically an active oxygen enriched or reactive oxygen enriched plasma that is generated from a gas containing oxygen. The plasma may be generated, for example, either by a high frequency or direct current discharge.

The concentration of reactive oxygen in the plasma is dependent upon the conditions under which the plasma is generated and has an influence on the resulting oxide film. For example the rate of film formation or the oxidation rate and the quality of the finished silicon oxide film may be influenced by the concentration of oxygen in the plasma. However, it is preferred that the plasma used for oxidizing the substrate have a substantially uniform density of active oxygen to achieve less variability in qualities of the finished film.

A processing parameter that may influence the resulting oxide film includes the pressure under which plasma oxidation is carried out. Plasma oxidation tends to be carried out a low pressure. In certain embodiments of the invention, plasma oxidation is carried out at a pressure in a range of from about 0.01 torr to about 1.0 torr. In another embodiment of the invention, plasma oxidation is carried out at a pressure in a range of from about 0.07 torr to about 0.5 torr. In another embodiment of the invention, plasma oxidation is carried out at a pressure in a range of from about 0.1 torr to about 0.5 torr. Specific operating pressures for plasma oxidation may be selected from 0.1, 0.15, 0.2, 0.25, 0.3, 0.35, 0.4, 0.45, and 0.5 torr.

Other parameters that may influence the oxidation rate and the extent of film formation as well as other oxide film properties include plasma operating temperature, bias power of the plasma oxidation process, substrate temperature, plasma density, and dopant concentration of the substrate. Conventionally, plasma oxidation has been known to lead to poor quality silicon dioxide films. In certain embodiments of the invention, the plasma operating temperature may be anywhere in a range of from about 400° C. to about 600° C. In particular embodiments of the invention, for instance, the plasma operating temperature may be about 500° C. In certain embodiments of the invention, the bias power of the plasma system may be in a range of from about 200 W to about 1200 W.

Following the step of forming an oxide layer across the conformal first conductive layer 230, the method of fabricating a gate structure 200 may comprise a step of removing at least the oxide layer 240. In an exemplary embodiment of the invention, a wet clean process operation is used to remove the oxide layer and all or part of the conformal first conductive layer from the semiconductor gate structure. A wet clean process is typically at least a two-step process for cleaning the substrate of a semiconductor that involves the application of a standard clean alkaline solution to the surface of the semiconductor followed by the application of a standard clean acidic solution to the surface of the semiconductor for the removal of the oxide layer from the surfaces of the trench.

Following these steps, the profile of the resulting trench is better defined such as that shown in FIG. 1C. The semiconductor having these better defined trenches may then be subjected to additional steps. For example, the method of fabricating a semiconductor gate structure 200 may comprise the step of forming a second conductive on the first conductive layer 250. In an embodiment of the invention, a second conductive layer is disposed within the trench of the conductive fill structure and forms a layer disposed atop of the conductive fill structure similar to the illustrative embodiment represented by FIG. 2.

Certain embodiments of the invention, for example, may include filling the trench with a second conductive material or even more than one material, for example, a dielectric material and a conductive material. Any conventional technique known in the art may be used to fill the trench with a filling material. Any excess material applied to the gate structure may be removed from the gate structure. For example, a chemical mechanical planarization process is an exemplary process the may be used to remove the excess filling material from the trench. Topologically selective slurry and/or an abrasive trapped pad or abrasive mounted pad may be used in the removal operation. However, any process known in the art for the removal of excess filling material may be used to remove the excess filling material from the trench.

Figure 5:
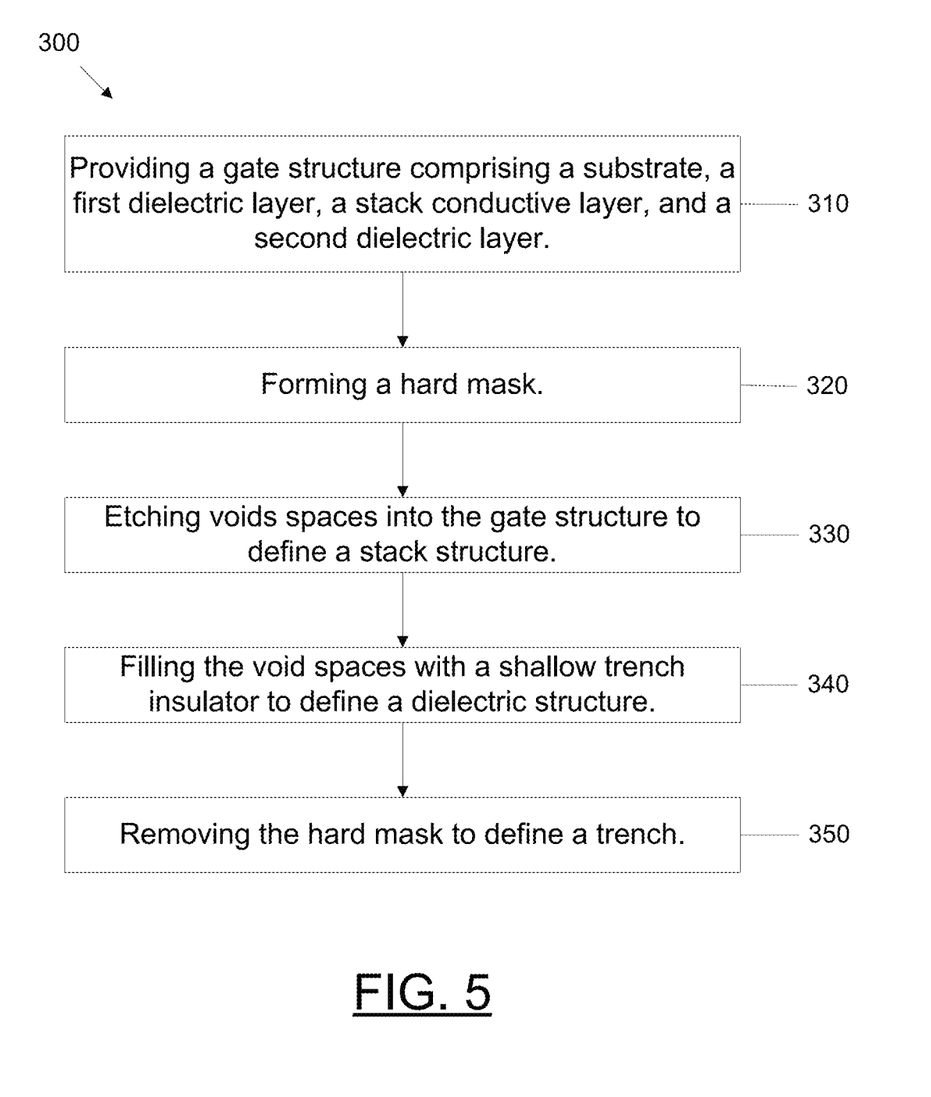
FIG. 5 is a flowchart illustrating a process for fabricating a trench according to an embodiment of the invention.

FIG. 5 is a flowchart illustrating a process for fabricating a trench according to an embodiment of the invention. Such a trench, for example, may be the trench provided in the process shown in FIG. 4 according to certain embodiments of the invention. The process for fabricating a trench 300 comprises providing a stack structure 310 comprising a substrate, a first dielectric layer disposed on the substrate, a stack conductive layer disposed on the first dielectric layer, and a second dielectric layer disposed on the stack conductive layer.

In certain embodiments of the invention, the process for fabricating a trench 300 may additionally comprise the steps of forming a hard mask 320, etching void spaces into the gate structure to define a stack structure 330, filling the void spaces with a shallow trench insulator to define a dielectric structure 340, and removing the hard mask to define a trench 350.

Figure 7A:
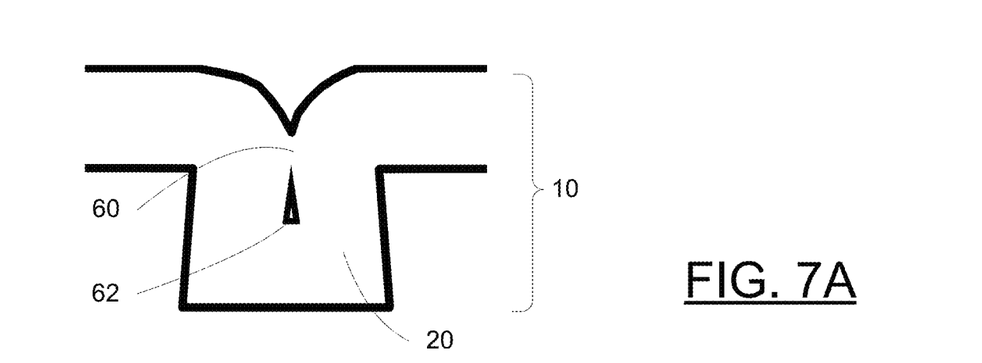
FIG. 7A illustrates a profile of a conductive fill structure following deposition of a first conductive layer according to an embodiment of the invention.
Figure 7B:
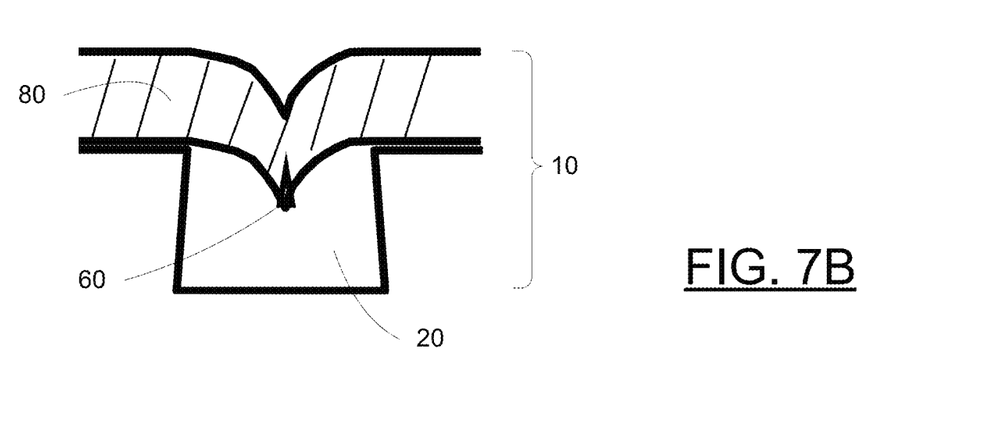
FIG. 7B illustrates a profile of a conducive fill structure following deposition of a second conductive layer according to an embodiment of the invention.

FIGS. 7A and 7B illustrate another embodiment of the invention. FIG. 7A shows a conductive fill structure 10 where a first conductive layer 60 has been deposited across the trench 20. Further pursuant to this embodiment, the first conductive layer 60 may be thick enough such that the first conductive layer 60 substantially fills the trench 20. Due to certain limitations that may exists in applying the first conductive layer 60 to the trench 20, voids 62 may be formed after depositing the first conductive layer 60. An oxidation process may be performed on the first conductive layer 60 to form an oxide layer 80 across the surface of the first conductive layer 60 as described herein and further represented in the illustrative embodiment of FIG. 7B. In certain embodiments of the invention, the oxide layer 80 formed during the oxidation process may extend to the voids 62 in the first conductive layer 60.

Following removal of the oxide layer, the first conductive layer 60 is exposed and an opening approximated by a V-shape is formed in the first conductive layer 60. Subsequently, a second conductive layer (not shown) may be applied across the first conductive layer 60. According to this embodiment of the invention, an interface between the first conductive layer 60 and the second conductive layer is substantially free of any voids. Moreover, a ratio of the thickness of the first conductive layer 60 at the top of the trench, $D_1$, relative to the thickness of the first conductive layer 60 at the bottom of the trench, $D_2$ ranges from about 50% to about 95%.

The filled trench using the methods of the invention or using the trench provided by the invention is characterized by a substantial decrease in void space over other conventionally filled trenches. In certain embodiments of the invention, the amount of void space reduction in the filling material of the trench is at least about 10%, at least about 20%, at least about 25%, at least about 30%, at least about 50%, at least about 75%, and at least about 90%. In certain embodiments of the invention, the amount of void space reduction in the filling material of the trench is at least about 95% and, more preferably, at least about 99%. In yet other embodiments of the invention, the amount of void space reduction in the filling material of the trench may be about 100%.

In embodiments of the invention, the filling material of the trench is substantially free of any void space.

An aspect of the invention provides a semiconductor gate structure fabricated using the processes or methods for fabricating a semiconductor gate structure of the invention. In certain other embodiments of the invention, a semiconductor device may be fabricated using any methods as described herein.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A gate structure comprising:
    a trench, the trench assembled by a dielectric structure and a stack structure; and
    a conductive fill structure disposed on the stack structure and the dielectric structure,
    wherein the conductive fill structure comprises two or more conductive layers,
    wherein the two or more conductive layers comprise a first conductive layer conformally disposed on the dielectric structure and the stack structure, and
    wherein the first conductive layer has a first thickness at a region adjacent to the dielectric structure and a second thickness at another region adjacent to the stack structure, wherein a ratio of the first thickness to the second thickness is in a range of from about 50% to about 95%.

2. The gate structure of claim 1, wherein the stack structure comprising:
    a substrate;
    a first dielectric layer disposed on the substrate;
    a third conductive layer disposed on the first dielectric layer; and
    a second dielectric layer disposed on the third conductive layer.

3. The gate structure of claim 2, wherein the dielectric structure extends to the substrate and is adjacent to the stack structure.

4. The gate structure of claim 1, wherein the two or more conductive layers comprise a second conductive layer disposed on the first conductive layer.

5. The gate structure of claim 1, wherein a bottom portion of the trench is defined by the stack structure.

6. The gate structure of claim 1, wherein a sidewall portion of the trench is defined by the dielectric structure.

7. The gate structure of claim 1, wherein the first conductive layer has a U-shaped opening.

8. The gate structure of claim 1, wherein the first conductive layer has a V-shaped opening.

* * * * *